(12) United States Patent
Inamdar

(10) Patent No.: US 9,620,228 B1
(45) Date of Patent: Apr. 11, 2017

(54) MONOTONICALLY INCREASING PERSISTENT COUNTERS

(71) Applicant: Marvell International Ltd., Hamilton (BM)

(72) Inventor: Amey Dattatray Inamdar, Pune (IN)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/078,416

(22) Filed: Mar. 23, 2016

Related U.S. Application Data

(60) Provisional application No. 62/163,053, filed on May 18, 2015, provisional application No. 62/183,508, filed on Jun. 23, 2015.

(51) Int. Cl.
*G11C 16/04* (2006.01)
*G11C 16/16* (2006.01)

(52) U.S. Cl.
CPC .................................. *G11C 16/16* (2013.01)

(58) Field of Classification Search
CPC ........ G11C 16/16; G11C 16/14; G11C 7/1018
USPC ............................................. 365/185.29, 236
See application file for complete search history.

(56) References Cited

U.S. PATENT DOCUMENTS 8,238,167 B2 * 8/2012 Aritome .............. G11C 11/5628
365/185.24

* cited by examiner

*Primary Examiner* — Huan Hoang

(57) ABSTRACT

A monotonically increasing persistent counter is described that is persistent across reboots of a system in which it is incorporated. The described counter employs an event counter module that counts events that are generated by various event generators within the system. One type of event that can be counted by the described counter is a state change. In various implementations, the event counter module, when employed as a state change counter module, includes a state change counter that counts state changes, and a journal mode component which provides journaling functionality which makes it possible to accommodate large numbers of state changes while, at the same time, recover the counter in the event of a system failure. In at least some embodiments, one or both of the state change counter and the journal mode component are implemented using NOR flash memory.

20 Claims, 8 Drawing Sheets

MONOTONICALLY INCREASING PERSISTENT COUNTERS

RELATED APPLICATIONS

This application claims priority to U.S. Provisional Patent Application Ser. No. 62/163,053 filed May 18, 2015, and U.S. Provisional Application 62/183,508 filed Jun. 23, 2015, the disclosures of which are incorporated by reference herein in their entirety.

BACKGROUND

The background description provided herein is for the purpose of generally presenting the context of the disclosure. Unless otherwise indicated herein, the approaches described in this section are not prior art to the claims in this application and are not admitted to be prior art by inclusion in this section.

Many different types of memory devices can be used to maintain and store data and instructions for various computers and similar systems. In particular, flash memory is a type of electronic memory media that can be rewritten and that can retain content without consumption of power. Unlike dynamic random access memory (DRAM) devices and static random memory (SRAM) devices in which a single byte can be erased, flash memory devices are typically erased in fixed multi-bit blocks or sectors. Flash memory technology can include NOR flash and NAND flash, for example. NOR flash evolved from electrically erasable read only memory (EEPROM) chip technology, in which, unlike flash, a single byte can be erased. NAND flash evolved from DRAM technology. Flash memory devices are less expensive and denser as compared to many other memory devices, meaning that flash memory devices can store more data per unit area.

Flash memory has become popular, at least in part, because it combines the advantages of the high density and low cost of EPROM with the electrical erasability of EEPROM. Flash memory is nonvolatile—which means that it can be rewritten and can hold its content without power. It is used in many portable electronic products, such as cell phones, portable computers, voice recorders, thumbnail drives and the like, as well as in many larger electronic systems, such as cars, planes, industrial control systems, etc. The fact that flash memory can be rewritten, as well as its retention of data without a power source, small size, and light weight, have all combined to make flash memory devices useful and popular means for transporting and maintaining data.

While flash memory has certain advantages, there is a desire to improve the lifetime of flash memory devices, as flash memory blocks or sectors can be subject to failure or programming errors after a certain number of cycles.

In digital logic and computing, a counter is a device which stores the number of times a particular event or process has occurred. Because of some of the properties and characteristics of flash memory described above, flash memory provides a highly desirable, low cost option to implement counters. However, other properties of flash memory, such as limited erase cycles, present significant challenges, particularly if the number of events being counted is large.

SUMMARY

This summary is provided to introduce subject matter that is further described below in the Detailed Description and Drawings. Accordingly, this Summary should not be considered to describe essential features nor used to limit the scope of the claimed subject matter.

A monotonically increasing persistent counter is described that is persistent across reboots of a system in which it is incorporated. The described counter employs an event counter module that counts events that are generated by various event generators within the system. One type of event that can be counted by the described counter is a state change. In various implementations, the event counter module, when employed as a state change counter module, includes a state change counter that counts state changes, and a journal mode component which provides journaling functionality which makes it possible to accommodate large numbers of state changes while, at the same time, recover the counter in the event of a system failure. In at least some embodiments, one or both of the state change counter and the journal mode component are implemented using NOR flash memory.

BRIEF DESCRIPTION OF THE DRAWINGS

The details of one or more implementations are set forth in the accompanying figures and the detailed description below. In the figures, the left-most digit of a reference number identifies the figure in which the reference number first appears. The use of the same reference numbers in different instances in the description and the figures indicate like elements.

DETAILED DESCRIPTION

This disclosure describes apparatuses and techniques for a monotonically increasing persistent counter that is persistent across reboots of the system in which it is incorporated. The described counter employs an event counter module that counts events that are generated by various event generators within the system. One type of event that can be counted by the described counter is a state change. In various implementations, the event counter module, when employed as a state change counter module includes a state change counter that counts state changes, and a journal mode component which provides journaling functionality which makes it possible to accommodate large numbers of state changes while, at the same time, recover the counter in the event of a system failure, such as one that might occur during an erase operation or a write operation. In at least some embodiments, one or both of the state change counter and the journal mode component are implemented using NOR flash memory.

Figure 1:
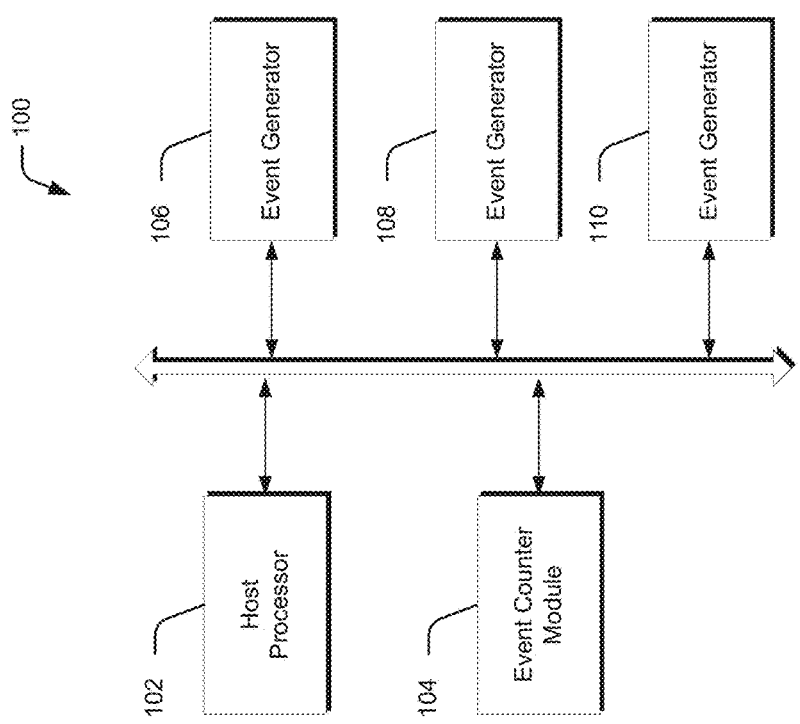
FIG. 1 illustrates an example system including an event counter in accordance with one or more embodiments.

FIG. 1 illustrates an example system in accordance with one or more embodiments generally at 100. System 100 includes, in this example, a host processor 102, an event counter module 104, and one or more event generators 106, 108, and 110.

Host processor 102 is operably connected to event counter module 104 to facilitate implementation of a monotonically increasing persistent counter. The host processor 102 can be a typical application processor that can manage communications and run applications. For example, the host processor 102 can be a processor utilized by a computer, a mobile handset, personal data assistant (PDA), or any other electronic device.

Event counter module 104 is configured as a monotonically increasing persistent counter that counts events that emanate from one or more event generators, such as event generators 106, 108, and 110. In various embodiments, the event counter module 104 can employ flash memory, for example NOR or NAND flash memory, in a journaling mode which makes it possible to accommodate and count a large number of events in a manner that provides a low-cost, efficient solution to other higher-cost alternatives, such as battery-backed memory and the like. In addition, as will become apparent below, the additional time and overhead associated with the inventive monotonically increasing persistent counter is quite small and, from a design perspective, very desirable.

Event generators 106, 108, and 110 are representative of any functionality or entity that can generate an event that can be counted by event counter module 104 using a monotonically increasing persistent counter. In this context, the event generators can generate any suitable type of event for which a monotonically increasing persistent counter can be utilized. As such, event generators can include, by way of example and not limitation, applications, processes, devices, components of devices, and the like. For example, this technique can be used in industrial actuators where a valve is turned on and off. This mechanism can provide a count for events if they occur in larger numbers. Any other binary state change application running on NOR memory-based systems would benefit from this approach. In at least some embodiments, when an event generator generates an event, a notification of the event can be sent to the event counter module 104 so that the event can be counted. One specific example of an event generator is provided below in a section entitled "Implementation Example."

Figure 2:
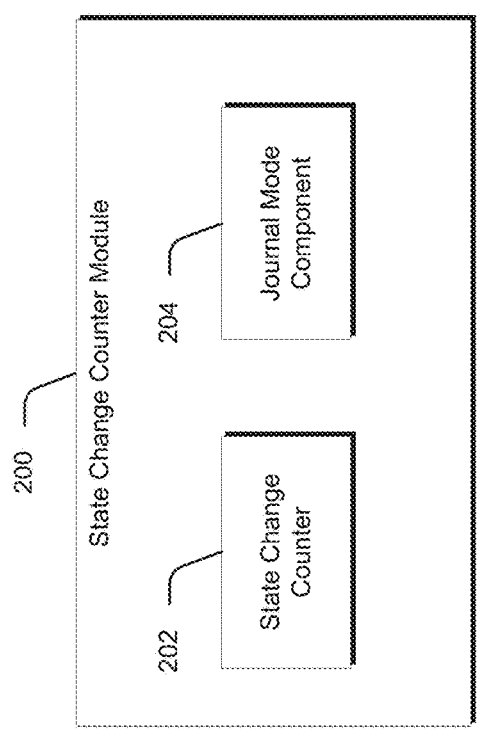
FIG. 2 illustrates an example state change counter module that includes a state change counter and a journal mode component in accordance with one or more embodiments.

FIG. 2 illustrates a specific example of an event counter module in the form of a state change counter module 200. In this example, the events that are counted reside in the form of state changes which are generated by the event generators such as event generators 106, 108, and 110 in FIG. 1. The term "state" refers to an operating characteristic or property of an event generator. For example, a state change can involve turning from an "off" state to an "on" state. Alternately or additionally, a state change can involve changing an operating characteristic or property such as transitioning from one operating mode to another operating mode. For example, a device may be in a "holding" state where it is on but not operational, and may then transition into a "working" state where it is on and operational. Accordingly, generally speaking, the term "state", as it pertains to changes, broadly refers to these types of state changes as well as a variety of other state changes. When a state change occurs, the event generator can send a notification to the state change counter module 200 so that the state change can be counted.

In the illustrated and described embodiment, the state change counter module 200 includes a state change counter 202 and a journal mode component 204. In various embodiments, each of the state change counter 202 and the journal mode component 204 is implemented using flash memory. In particular embodiments, the state change counter 202 and the journal mode component 204 are implemented using NOR flash memory. Some properties and characteristics of NOR flash memory include having around 100,000 erase cycles in its lifetime. Thus, NOR flash memory has a limited number of erase cycles that have been considered in this design. In addition, NOR flash memory typically has a 4 KB sector as an erase unit. The time required to write a single byte in an erased sector is from between 30-50 microseconds. The time required for a 4 KB sector erase is from between 30-500 milliseconds. Multiple writes on the same byte are possible as long as binary 0 is not required to be changed to a 1. Keeping it the same or changing from a 1 to a 0 is possible.

In this example, the state change counter 202 is used to keep track of state changes within a particular system. That is, when a state change occurs, the state change counter module 200 can be notified and a bit value in the state change counter 202 is modified to account for the state change. Modifying bit values in the state change counter 202 allows the number of state changes to be counted in a monotonically increasing manner.

The journal mode component 204 performs a journaling function which helps to ensure that the monotonically increasing counter is persistent across restarts, reboots or system failures, such as a system failure that might occur during an erase operation or a write operation. Any suitable type of journaling function can be employed, an example of which is provided below. The journal mode component essentially enables documentation of a complete transaction and, in the event of an interruption in the transaction, enables the system to accurately recover to the point where the transaction was interrupted and to ascertain whether the transaction was complete. In the present case, the transaction pertains to documenting or otherwise counting state changes in a particular system. Using NOR flash memory in the journaling mode makes it possible to accommodate a large number of state changes, given limitations of the NOR flash memory's erase cycles, while at the same time reduces the additional time and space overhead of tracking these changes.

Figure 3:
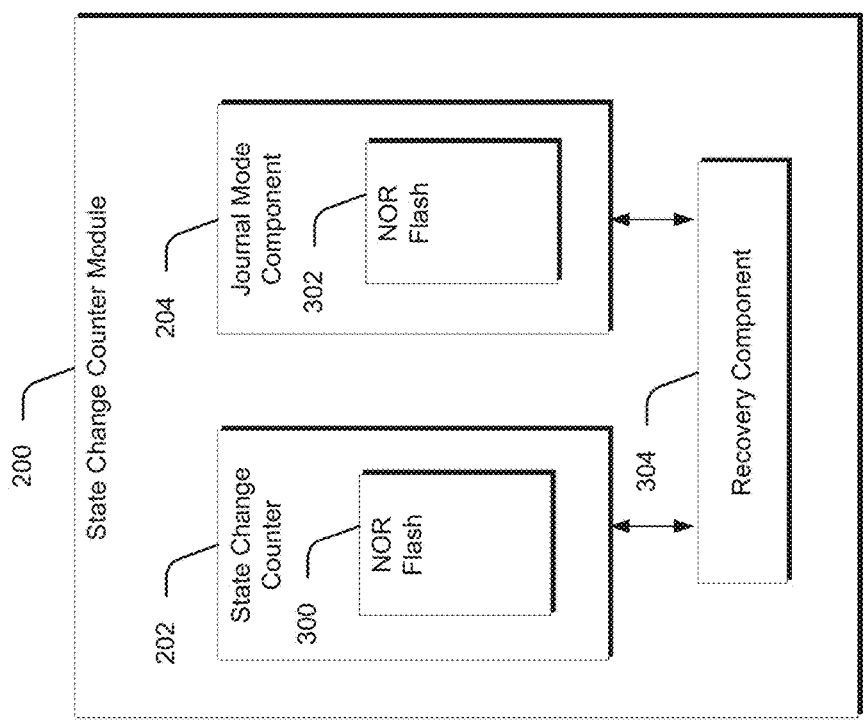
FIG. 3 illustrates an example state change counter module in accordance with one or more embodiments.

In the illustrated and described example, any suitable number of NOR flash memory sectors can be utilized to implement state change counter module 200. As but one example, consider FIG. 3.

There, state change counter module 200 is shown as including the state change counter 202 and the journal mode component 204. The state change counter 202 includes a NOR flash memory component 300 and the journal mode component includes a NOR flash memory component 302. In addition, the state change counter module 200 includes a recovery component 304 which is operably coupled to both the state change counter 202 and the journal mode component 204.

For purposes of this discussion, assume that each NOR flash memory component 300, 302 represents a sector where each sector is 4 KB in size. In operation, both sectors are treated as bit arrays of 32 Kbits. Initially, both sectors are fully erased with each bit being set to "1". When a state change occurs, the first bit with a value of "1" in NOR flash memory component 300 is changed from a "1" to a "0". When the next state change occurs, the second bit with a value of "1" in the NOR flash memory component 300 is changed to a "0", and so on. This provides an ability to count 32,000 state changes using the NOR flash memory component 300. When the NOR flash memory component 300 has had all of its bits set to "0", the first bit containing a "1" in the NOR flash memory component 302 is changed to "0". The NOR flash memory component 300 is then erased (having all of its bits set to "1"), and the next bit containing a "1" in the NOR flash memory component 302 is changed to "0". Using the journal mode component's NOR flash memory component 302 in this manner enables the system to ascertain how many times the state change counter's NOR flash memory component 300 has been erased. That is, the journaling functionality is provided by the journal mode component 204 by first changing a bit value in the NOR flash memory component 302, then erasing the NOR flash memory component 300, and only then changing the next bit value in the NOR flash memory component 302. The information that this conveys is that, in the event of a system failure, upon boot up, if the NOR flash memory component 302 has an even number of 0's, the system did not fail while the NOR flash memory component 300 was being erased. As such, the counter value can be easily recovered by the recovery component 304. On the other hand, in the event of a system failure, upon boot up, if the NOR flash memory component 302 has an uneven number of 0's, the counter value can be easily recovered by the recovery component 304 because one can ascertain exactly when the system failed. In this case, the system failure occurred after the last bit in NOR flash memory component 302 was changed to a "0", but before the time when the NOR flash memory component 300 was fully erased. In this case, the NOR flash memory component 300 can now be erased and the first (or next) "1" bit in the NOR flash memory component 302 can be set to "0". In this case, the NOR flash memory component 300 is again ready to continue to count changes and the NOR flash memory component 302 has an even number of "0's".

So, employing the above approach, using the nomenclature below, the state change count can be computed as follows:

State change count=(number of "0" bits in sector $B/2$)*32K+(number of "0" bits in sector $A$)

where sector A represents NOR flash memory component 300, and sector B represents NOR flash memory component 302.

In the above computation, the term "(number of "0" bits in sector $B/2$)*32K" represents the count value associated with the number of times sector B has journaled sector A being fully used to count state changes, i.e. how many times sector A counted has 32,000 state changes. The term "(number of "0" bits in sector A)" represents the state change count registered in sector A. The maximum number of state changes supported by using two sectors of NOR flash memory as described above is given as follows:

(32K/2)*(32K)=512M=536 million

Here, "(32K/2)" represents sector B's use of 2 bits to document each complete erase of sector A, and "(32K)" represents the 32,000 state changes that can be counted by sector A before having to be erased. If the state changes to be tracked in any particular system are more than this value, additional levels of journaling can be used by adding additional flash memory sectors. Having considered the above described embodiments, consider now example methods in accordance with one or more embodiments.

Example Methods

Figure 4:
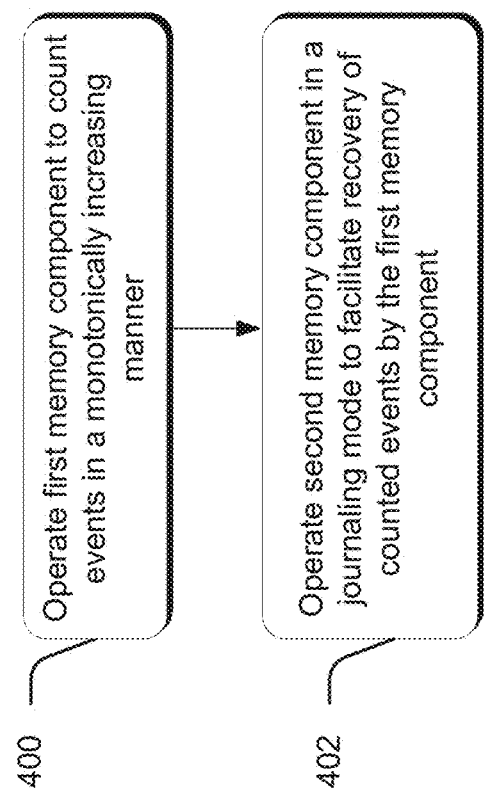
FIG. 4 is a flow diagram that describes steps in a method in accordance with one or more embodiments.

FIG. 4 illustrates a flow diagram that describes steps in a method in accordance with one or more embodiments. The method can be implemented in connection with any suitable hardware, software, firmware, or combination thereof. In the illustrated and described embodiment, the method can be implemented by a suitably-configured event counter module, such as event counter module 104 in FIG. 1.

Step 400 operates a first memory component to count events in a monotonically increasing manner. This step can be performed in any suitable way. In at least some embodiments, the first memory component comprises a flash memory component and, more specifically, a NOR flash memory component. In addition, any suitable type of events can be counted by the first memory component. In at least some embodiments, the events reside in the form of state changes, such as those described above and below. Step 402 operates a second memory component in a journaling mode to facilitate recovery of counted events by the first memory component. This step can be performed in any suitable way. In at least some embodiments, the second memory components comprises a flash memory component and, more specifically, a NOR flash memory component.

Figure 5:
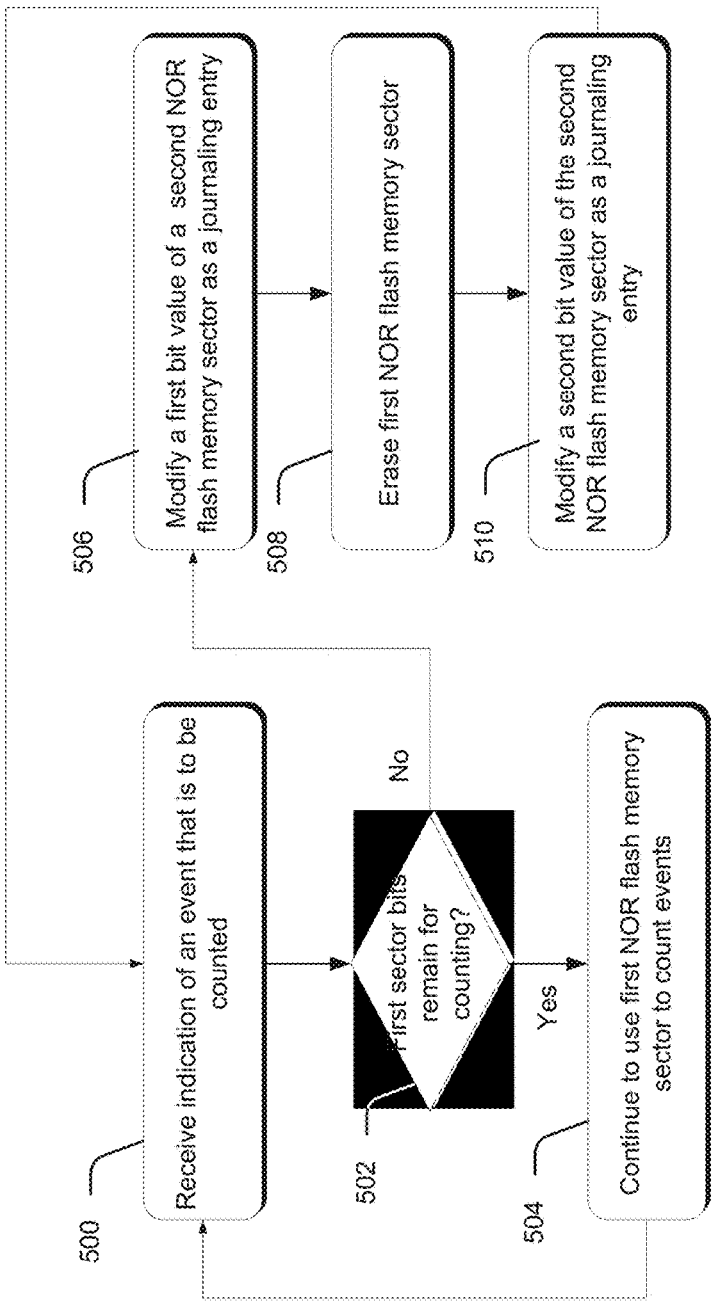
FIG. 5 illustrates is a flow diagram that describes steps in a method in accordance with one or more embodiments.

FIG. 5 illustrates a flow diagram that describes steps in a method in accordance with one or more embodiments. The method can be implemented in connection with any suitable hardware, software, firmware, or combination thereof. In the illustrated and described embodiment, the method can be implemented by a suitably-configured event counter module, such as event counter module 104 in FIGS. 1-3.

Step 500 receives an indication of an event that is to be counted. Any suitable indication can be received such as a notification from an entity that generated the event. In some embodiments, the event corresponds to a state change in a system. In this instance, the indication can be generated by a component or device whose state has changed, and then provided to a corresponding state change counter module. Step 502 ascertains whether a first NOR flash memory sector has bits remaining that can be used to count the event. Responsive to the first NOR flash memory sector having bits remaining that can be used for counting the event, step 504 continues to use the first NOR flash memory sector to count the events and returns to step 500 to receive indications of additional events. If, on the other hand, no bits remain in the first NOR flash memory sector to count events, step 506 modifies a first bit value of a second NOR flash memory sector as a journaling entry. Step 508 erases the first NOR flash memory sector and step 510 modifies a second bit value of the second NOR flash memory sector as a journaling entry. The method then returns to step 500 to receive further indications of additional events. This process can continue until no additional bits remain in the second NOR flash memory for journaling entries.

If the second NOR flash memory sector has been fully used for journaling, meaning that the sector has all "0" entries, additional NOR flash memory sectors can be utilized to provide further journaling functionality.

The above-described embodiments can be implemented without extra hardware cost or components. In addition, impacts in terms of space and time requirements to track state changes can be reduced and mitigated using low-cost flash memory. The solution can enable very large counts to be achieved and is easily extensible to enable even larger counts to be achieved. Implementation logic complexity is quite small and can be easily achieved using low-power microcontrollers.

Having considered the above embodiments, consider now an implementation example in a specific context.

IMPLEMENTATION EXAMPLE

As noted above, the inventive monotonically increasing persistent counter can be implemented in connection with a wide variety of systems in which various events are to be counted. Events can include any suitable type of event or events that are desired to be counted. One such event is a state change. State changes can occur in a wide variety of systems. As but one example of a system in which the inventive principles can be implemented, consider a home automation system.

Figure 6:
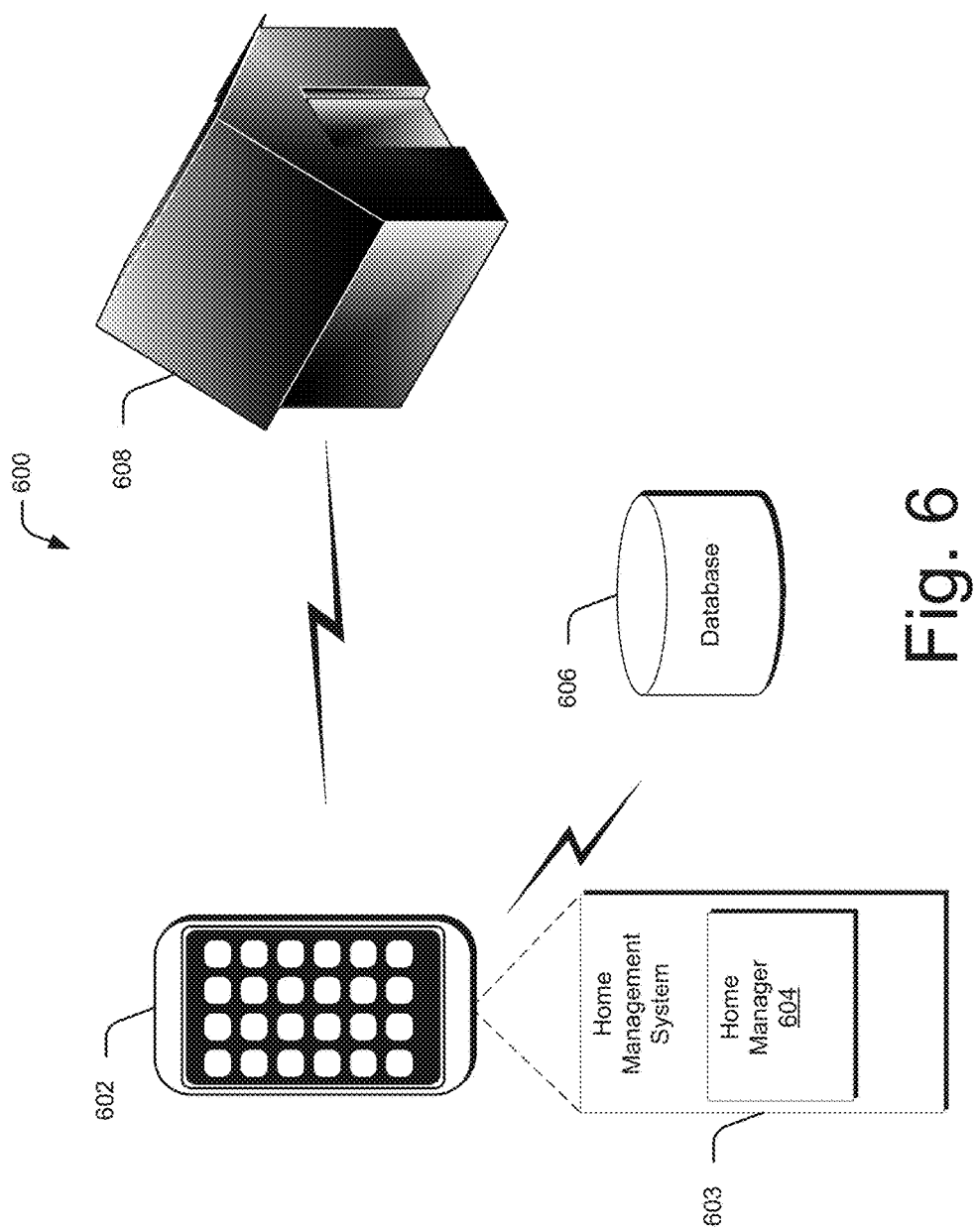
FIG. 6 illustrates one example of a system that can employ the inventive embodiments described herein.

In various embodiments, a home automation system provides a framework for communicating and controlling connected devices, such as low-power smart devices that are present in a user's home. Home automation systems can enable homeowners or users to discover and map devices in their home and configure them by way of a computing device, such as a computing device located in the home or a mobile device. Some systems allow users to define an action or group a set of actions and invoke them remotely on devices in their home. This can unify and simplify the control of various appliances, devices and accessories of a home. As an example, consider FIG. 6.

There, an example system is shown, generally at 600, in accordance with one or more embodiments. System 600 includes a mobile computing device such as a smart phone 602 that includes a home management system 603 having a home manager 604, a database 606, and a home 608 which includes one or more smart devices termed "accessories," that can be controlled remotely by way of smart phone 602.

Smart phone 602 can include multiple different applications or "apps" that enable a user to control smart devices that are present in home 608. In this example, one such app is the home manager 604. The database 606 is used to maintain information created for home 608 irrespective of the app that created the information.

In the illustrated and described embodiment, the home management system 603 uses home manager 604 as a gateway to database 606. The home manager 604 allows a user to manage one or more homes, control accessories, and notify changes, if any, to be added to the homes. The home manager allows users to add or remove homes from the home management system 603. Information pertaining to homes that are managed by the home manager is maintained in database 604.

In this particular example, each home in a user's system has a unique name so that it can be recognized by the home management system. In this scheme, a home contains rooms and rooms include accessories. Accessories correspond to an actual physical device that the user wishes to control. An accessory is assigned to a single room and whenever there is a change to an accessory, such as a state change or rename, a corresponding application receives a notification and the state change can be counted as described above. Individual accessories are assigned a particular service which represents some functionality associated with respect to its characteristics. For example, an accessory may be a lightbulb and its power state is the service characteristic with which an app can interact. Other examples of accessories can include garage door openers, thermostats, door locks, IP camera controls, switches, televisions, entertainment systems, appliances, as well as other devices that can be customized by the user. Other examples of service characteristics can include, by way of example and not limitation, range, units, stepper values, power state, block state, target state, and the like. So, characteristics are a parameter of a service that allows interaction. Characteristics can include read only characteristics such as "current temperature", read-write characteristics such as "target temperature", and write-only characteristics such as those that enable writing data to some device in order to act based upon some conditions such as opening a garage door on a beep on my device.

In operation, a user can use their smart phone 602 to remotely interact with and control their accessories by causing various actions to be performed. Such actions can include, by way of example and not limitation, turning lights on and off, locking or unlocking doors, turning temperatures up or down, closing or opening gates and any other suitable type of action that can be performed on any type of accessory. These actions can, in turn, causes state changes to the system which can be counted by the above-described monotonically-increasing persistent counter.

Having considered the embodiments described above, consider now an example operating environment in accordance with one or more embodiments.

Operating Environment

Figure 7:
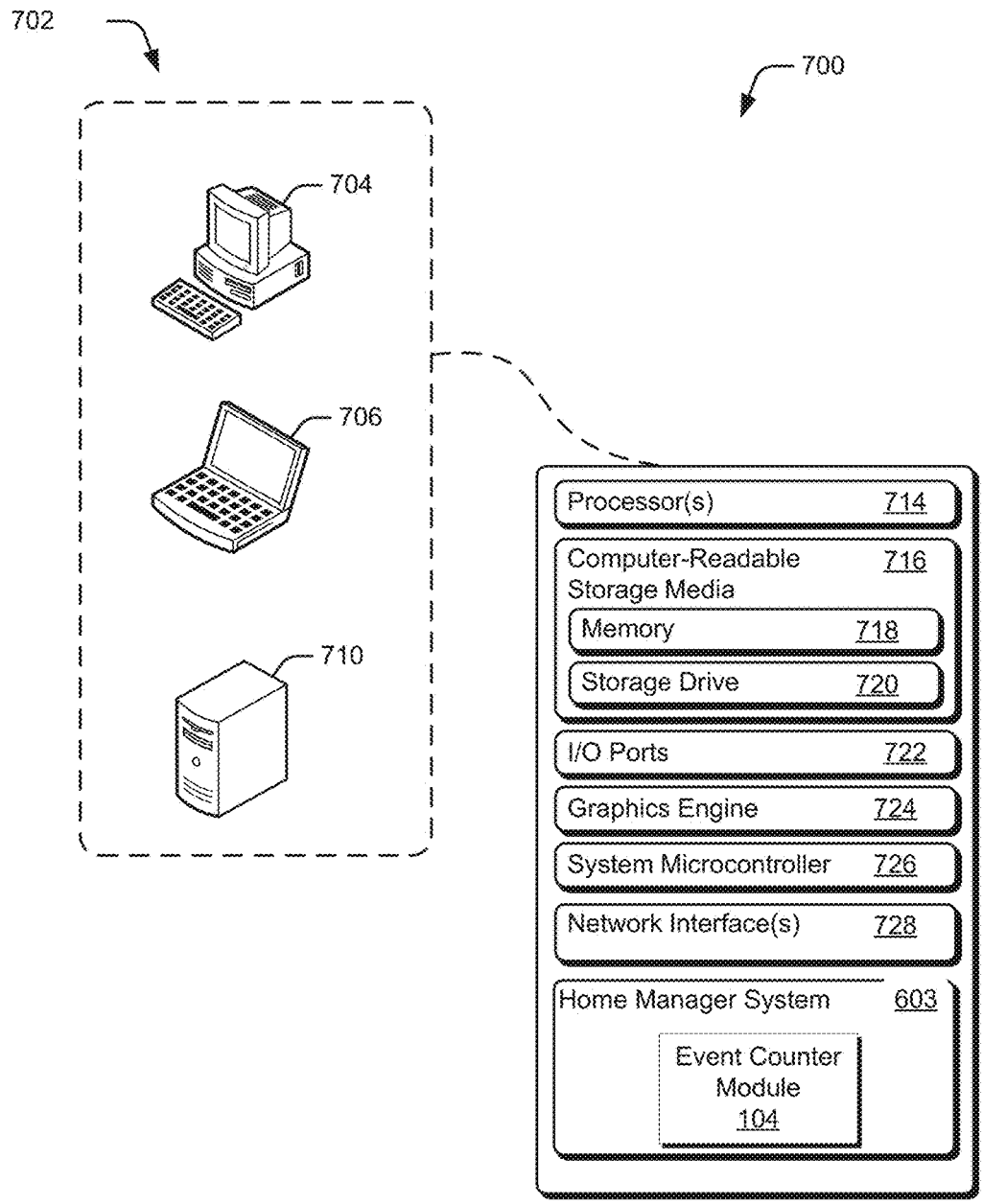
FIG. 7 illustrates an example operating environment in accordance with one or more embodiments.

FIG. 7 illustrates an example operating environment in accordance with one or more embodiments generally at 700. The environment can include multiple types of devices 702 that can use the inventive principles described herein.

Devices 702 can include desktop computer 704, laptop computer 706, server 710, as well as a variety of other devices.

Each device 702 includes processor(s) 714 and computer-readable storage media 716. Computer-readable storage media 716 may include any type and/or combination of suitable storage media, such as memory 718 and storage drive(s) 720. Memory 718 may include memory such as dynamic random-access memory (DRAM), static random access memory (SRAM), read-only memory (ROM), or Flash memory useful to store data of applications and/or an operating system of the device 702. Storage drive(s) 720 may include hard disk drives and/or solid-state drives (not shown) useful to store code or instructions associated with an operating system and/or applications of device. Processor(s) 714 can be any suitable type of processor, either single-core or multi-core, for executing instructions or commands of the operating system or applications stored on storage drive(s) 720.

Devices 702 can also each include I/O ports 722, graphics engine 724, system microcontroller 726, network interface(s) 728, and a home manager system 603 that includes or otherwise makes use of an event counter module 104 that operates as described above and below.

I/O ports 722 allow device 702 to interact with other devices and/or users. I/O ports 722 may include any combination of internal or external ports, such as audio inputs and outputs, USB ports, Serial ATA (SATA) ports, PCI-express based ports or card-slots, and/or other legacy ports. I/O ports 722 may also include or be associated with a packet-based interface, such as a USB host controller, digital audio processor, or SATA host controller. Various peripherals may be operatively coupled with I/O ports 722, such as human-input devices (HIDs), external computer-readable storage media, or other peripherals.

Graphics engine 724 processes and renders graphics for device 702, including user interface elements of an operating system, applications, command interface, or system administration interface. System microcontroller 726 manages low-level system functions of device 702. Low-level system functions may include power status and control, system clocking, basic input/output system (BIOS) functions, switch input (e.g. keyboard and button), sensor input, system status/health, and other various system "housekeeping" functions. Network interface(s) 722 provides connectivity to one or more networks Having considered the above embodiments, consider now a system-on-a-chip that can be utilized in accordance with one or more embodiments.

System-on-Chip

Figure 8:
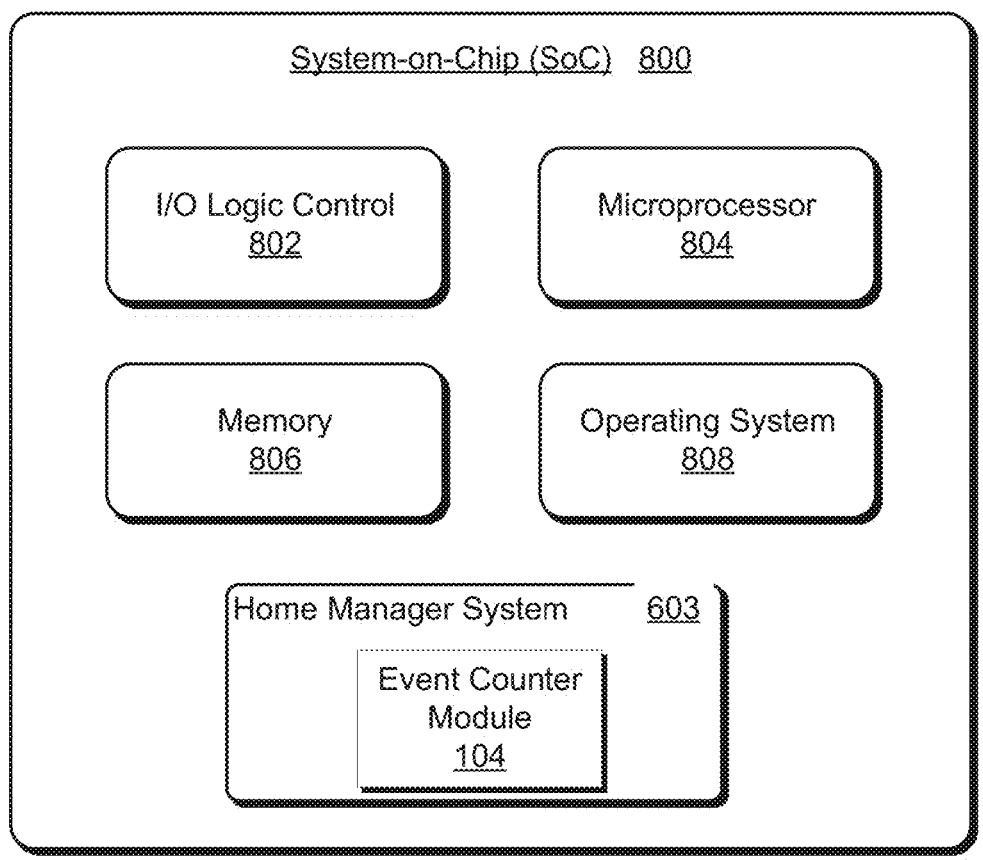
FIG. 8 illustrates a System-on-Chip (SoC) environment for implementing aspects of the techniques described herein.

FIG. 8 illustrates a System-on-Chip (SoC) 800, which can implement various embodiments described above. A SoC can be implemented in any suitable device that utilizes magnetic recording media and position error signals (PES) to correct off-track read head positions.

SoC 800 can be integrated with electronic circuitry, a microprocessor, memory, input-output (I/O) logic control, communication interfaces and components, other hardware, firmware, and/or software needed to provide communicate coupling for a device, such as any of the above-listed devices. SoC 800 can also include an integrated data bus (not shown) that couples the various components of the SoC for data communication between the components. A wireless communication device that includes SoC 800 can also be implemented with many combinations of differing components. In some cases, these differing components may be configured to implement concepts described herein over a wireless connection or interface.

In this example, SoC 800 includes various components such as an input-output (I/O) logic control 802 (e.g., to include electronic circuitry) and a microprocessor 804 (e.g., any of a microcontroller or digital signal processor). SoC 800 also includes a memory 806, which can be any type of RAM, SRAM, low-latency nonvolatile memory (e.g., flash memory), ROM, and/or other suitable electronic data storage. SoC 800 can also include various firmware and/or software, such as an operating system 808, which can be computer-executable instructions maintained by memory 806 and executed by microprocessor 804. SoC 800 can also include other various communication interfaces and components, communication components, other hardware, firmware, and/or software.

SoC 800 includes a home manager system 603 that includes or otherwise makes use of an event counter module 104 that operates as described above.

CONCLUSION

A monotonically increasing persistent counter is described that is persistent across reboots of a system in which it is incorporated. The described counter employs an event counter module that counts events that are generated by various event generators within the system. One type of event that can be counted by the described counter is a state change. In various implementations, the event counter module, when employed as a state change counter module, includes a state change counter that counts state changes, and a journal mode component which provides journaling functionality which makes it possible to accommodate large numbers of state changes while, at the same time, recover the counter in the event of a system failure, such as one that might occur during an erase operation or a write operation. In at least some embodiments, one or both of the state change counter and the journal mode component are implemented using NOR flash memory.

Although the subject matter has been described in language specific to structural features and/or methodological operations, it is to be understood that the subject matter defined in the appended claims is not necessarily limited to the specific features or operations described above, including orders in which they are performed.

What is claimed is:

1. A method comprising:
receiving an indication of an event corresponding to a state change that is to be counted in a system;
using a first NOR flash memory component to count the state change; and
using a second NOR flash memory component to provide journaling entries to enable recovery of counted state changes in the event of a system failure during an erase operation or a write operation.

2. The method of claim 1, wherein said using the first NOR flash memory component comprises modifying a bit value from a "1" to a "0" to count the state change.

3. The method of claim 1, wherein said using the second NOR flash memory component comprises modifying a bit value from a "1" to a "0" prior to erasing the first NOR flash memory component; and modifying a next bit value from a "1" to a "0" after erasing the first NOR flash memory component.

4. The method of claim 1, wherein:
said using the first NOR flash memory component comprises modifying a bit value from a "1" to a "0" to count the state change; and
said using the second NOR flash memory component comprises modifying a bit value from a "1" to a "0" prior to erasing the first NOR flash memory component; and modifying a next bit value from a "1" to a "0" after erasing the first NOR flash memory component.

5. The method of claim 1, wherein using the first NOR flash memory component comprises ascertaining whether the first NOR flash memory component has bits remaining that can be used to count the state change and, if so, continuing to use the first NOR flash memory component to count state changes and, if not, using the second NOR flash memory component to provide journaling entries by modifying a bit value from a "1" to a "0" prior to erasing the first NOR flash memory component and modifying a next bit value from a "1" to a "0" after erasing the first NOR flash memory component.

6. The method of claim 1, wherein said state changes are associated with state changes that occur in a home management system.

7. The method of claim 1, wherein said state changes are associated with state changes that occur in a home management system; and wherein said using the first NOR flash memory component comprises modifying a bit value from a "1" to a "0" to count the state change.

8. The method of claim 1, wherein said state changes are associated with state changes that occur in a home management system; and wherein said using the second NOR flash memory component comprises modifying a bit value from a "1" to a "0" prior to erasing the first NOR flash memory component; and modifying a next bit value from a "1" to a "0" after erasing the first NOR flash memory component.

9. The method of claim 1, wherein said state changes are associated with state changes that occur in a home management system; and wherein:
said using the first NOR flash memory component comprises modifying a bit value from a "1" to a "0" to count the state change; and
said using the second NOR flash memory component comprises modifying a bit value from a "1" to a "0" prior to erasing the first NOR flash memory component; and modifying a next bit value from a "1" to a "0" after erasing the first NOR flash memory component.

10. A system comprising:
a state change counter module comprising:
a state change counter having a first NOR flash memory component;

a journal mode component having a second NOR flash memory component; and wherein the state change counter module is configured to perform operations comprising:
receiving an indication of an event corresponding to a state change that is to be counted;
using the first NOR flash memory component to count the state change; and
using the second NOR flash memory component to provide journaling entries to enable recovery of counted state changes in the event of a system failure during an erase operation or a write operation.

11. The system of claim 10, wherein said using the first NOR flash memory component comprises modifying a bit value from a "1" to a "0" to count the state change.

12. The system of claim 10, wherein said using the second NOR flash memory component comprises modifying a bit value from a "1" to a "0" prior to erasing the first NOR flash memory component; and modifying a next bit value from a "1" to a "0" after erasing the first NOR flash memory component.

13. The system of claim 10, wherein using the first NOR flash memory component comprises ascertaining whether the first NOR flash memory component has bits remaining that can be used to count the state change and, if so, continuing to use the first NOR flash memory component to count state changes and, if not, using the second NOR flash memory component to provide journaling entries by modifying a bit value from a "1" to a "0" prior to erasing the first NOR flash memory component and modifying a next bit value from a "1" to a "0" after erasing the first NOR flash memory component.

14. The system of claim 10, wherein said using the first NOR flash memory component comprises modifying a bit value from a "1" to a "0" to count the state change; and wherein said using the second NOR flash memory component comprises modifying a bit value from a "1" to a "0" prior to erasing the first NOR flash memory component; and modifying a next bit value from a "1" to a "0" after erasing the first NOR flash memory component.

15. The system of claim 10, wherein said state changes are associated with state changes that occur in a home management system.

16. A system-on-chip comprising:
a microprocessor; and
a state change counter module which, when executed by the microprocessor, is configured to perform operations comprising:
operating a first flash memory component to count state changes in a monotonically increasing manner; and
operating a second flash memory component in a journaling mode that is configured to enable recovery of counted states by the first memory component in an event of a system failure during an erase operation or a write operation.

17. The system-on-chip of claim 16, wherein the first flash memory component comprises a NOR flash memory component.

18. The system-on-chip of claim 16, wherein the second flash memory component comprises a NOR flash memory component.

19. The system-on-chip of claim 16, wherein the first flash memory component and the second flash memory component comprise respective NOR flash memory components.

20. The system-on-chip of claim 16 incorporated in a home management system.

* * * * *